(12) United States Patent
Liang et al.

(10) Patent No.: US 8,331,409 B1
(45) Date of Patent: Dec. 11, 2012

(54) LOCKING OF A LASER TO AN OPTICAL INTERFEROMETER THAT IS STABILIZED TO A REFERENCE FREQUENCY

(75) Inventors: Wei Liang, Monrovia, CA (US); Anatoliy Savchenkov, Glendale, CA (US); Andrey B. Matsko, Pasadena, CA (US); Vladimir S. Ilchenko, Arcadia, CA (US); David Seidel, Alta Loma, CA (US); Lute Maleki, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 66 days.

(21) Appl. No.: 13/008,876

(22) Filed: Jan. 18, 2011

Related U.S. Application Data

(60) Provisional application No. 61/295,877, filed on Jan. 18, 2010.

(51) Int. Cl.
*H01S 3/13* (2006.01)

(52) U.S. Cl. ........... 372/32; 372/29.02; 372/18; 372/19; 372/29.016

(58) Field of Classification Search ............... 372/32, 372/29.02, 18, 19, 29.016
See application file for complete search history.

(56) References Cited

U.S. PATENT DOCUMENTS

| | | | |
|---|---|---|---|
| 4,835,782 A | 5/1989 | Kaede et al. | |
| 5,204,640 A | 4/1993 | Logan, Jr. | |
| 5,220,292 A | 6/1993 | Bianchini et al. | |
| 5,631,736 A * | 5/1997 | Thiel et al. | 356/486 |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,535,328 B2 | 3/2003 | Yao | |
| 6,567,436 B1 | 5/2003 | Yao et al. | |
| 6,580,517 B2 | 6/2003 | Lokai et al. | |
| 6,580,532 B1 | 6/2003 | Yao et al. | |
| 6,594,061 B2 | 7/2003 | Huang et al. | |

(Continued)

FOREIGN PATENT DOCUMENTS

JP         04-096386 A         3/1992

(Continued)

OTHER PUBLICATIONS

Capmany, J., et al., "Microwave Photonics Combines Two Worlds," *Nature Photonics*, 1:319-330, Jun. 2007.

(Continued)

*Primary Examiner* — Kinam Park
(74) *Attorney, Agent, or Firm* — Perkins Coie LLP

(57) ABSTRACT

Devices and techniques for locking a laser in frequency by locking a reference laser to a reference frequency and an optical interferometer to the reference laser and by locking the laser to a selected frequency produced by the optical interferometer.

20 Claims, 4 Drawing Sheets

U.S. PATENT DOCUMENTS

| | | |
|---|---|---|
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 7,587,144 B2 | 9/2009 | Ilchenko et al. |
| 7,630,417 B1 | 12/2009 | Maleki et al. |
| 7,634,201 B2 | 12/2009 | Maleki et al. |
| 7,738,527 B2 | 6/2010 | He |
| 7,801,189 B2 | 9/2010 | Maleki et al. |
| 7,813,651 B2 | 10/2010 | Ilchenko et al. |
| 7,869,472 B2 | 1/2011 | Maleki et al. |
| 7,929,589 B1 | 4/2011 | Ilchenko et al. |
| 7,965,745 B2 | 6/2011 | Maleki et al. |
| 7,991,025 B2 | 8/2011 | Maleki et al. |
| 8,089,684 B1 | 1/2012 | Koonath et al. |
| 8,094,359 B1 | 1/2012 | Matsko et al. |
| 8,102,597 B1 | 1/2012 | Maleki et al. |
| 8,111,722 B1 | 2/2012 | Maleki et al. |
| 8,155,913 B2 | 4/2012 | Eliyahu et al. |
| 8,155,914 B2 | 4/2012 | Eliyahu et al. |
| 8,159,736 B2 | 4/2012 | Maleki et al. |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2006/0159135 A1* | 7/2006 | Cliche et al. .................. 372/20 |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 | 5/2009 | Maleki et al. |
| 2009/0208205 A1 | 8/2009 | Eliyahu et al. |
| 2009/0251705 A1 | 10/2009 | Le et al. |
| 2009/0310629 A1 | 12/2009 | Maleki et al. |
| 2009/0324251 A1 | 12/2009 | Ilchenko et al. |
| 2011/0110387 A1 | 5/2011 | Maleki et al. |
| 2011/0150485 A1 | 6/2011 | Seidel et al. |
| 2011/0255094 A1 | 10/2011 | Mohageg et al. |
| 2012/0039346 A1 | 2/2012 | Liang et al. |

FOREIGN PATENT DOCUMENTS

| | | |
|---|---|---|
| JP | 05-190967 A | 7/1993 |
| JP | 11-274643 A | 10/1999 |
| WO | WO-01/96936 A1 | 12/2001 |
| WO | WO-2005/038513 A2 | 4/2005 |
| WO | WO-2005/055412 A2 | 6/2005 |
| WO | WO-2005/067690 A2 | 7/2005 |
| WO | WO-2005/122346 A2 | 12/2005 |
| WO | WO-2006/076585 A2 | 7/2006 |
| WO | WO-2007/143627 A2 | 12/2007 |

OTHER PUBLICATIONS

Dyer, S., et al., "Stability of Fiber Bragg Grating Wavelength Calibration References," *Bragg Gratings, Photosensitivity, and Poling in Glass Waveguides*, 55-57, Sep. 1-3, 2003, Monterey, CA.

Knabe, K., et al., "10 kHz Accuracy of an Optical Frequency Reference Based on 12C2H2-Filled Large-Core Kagome Photonic Crystal Fibers," *Optics Express*, 17(18):16017-16026, Aug. 31, 2009.

Nishimiya, N., et al., "Frequency Measuring System Using Mirror Gap Stabilized Fabry-Perot Interferometer," *Spectrochimica Acta Part A: Molecular and Biomolecular Spectroscopy*, 60(3):493-504, Feb. 2004.

Braginsky, V.B., et al., "Quality-Factor and Nonlinear Properties of Optical Whispering-Gallery Modes," *Physics Letters A*, 137(7, 8):393-397, May 1989.

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Sub-Micro Watt Photonic Microwave Receiver," *IEEE Photonics Technology Letters*, 14(11):1602-1604, Nov. 2002.

Ilchenko, V., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "RF photonic signal processing components: From high order tunable filters to high stability tunable oscillators," *IEEE Radar Conference*, pp. 1-6, May 2009.

Savchenkov, A., et al., "Tunable Resonant Single-Sideband Electro-Optical Modulator," *Digest of the IEEE/LEOS Summer Topical Meetings*, pp. 63-64, Jul. 2009.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Technology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

* cited by examiner

LOCKING OF A LASER TO AN OPTICAL INTERFEROMETER THAT IS STABILIZED TO A REFERENCE FREQUENCY

PRIORITY CLAIM AND RELATED APPLICATION

This patent document claims the benefits of U.S. Provisional Application. No. 61/295,877 entitled "Compact Frequency Reference and Laser Tuning System with High Precision and Stability" and filed Jan. 18, 2010, the entire disclosure of which is incorporated by reference as part of this document.

BACKGROUND

This document relates to devices and techniques for locking and tuning the frequency of a tunable laser.

In various laser applications, it is desirable to stabilize the laser frequency at a given frequency. Such applications include, for example, spectroscopic measurements and other devices based on stabilized lasers such as photonic tunable microwave filters, optical sensors (e.g., fiber Bragg grating sensor interrogation) and generation of microwave signals based on opto-electronic oscillators or mixing laser light form two lasers. A laser, however, tends to fluctuate in frequency due to external perturbations, thermal variations and other factors. Some commercial tunable lasers, for example, can drift or fluctuate in frequency on the order of tens of MHz in the free running condition. To meet frequency stability requirements in various applications, a laser can be stabilized in frequency by locking the laser to a frequency reference.

SUMMARY

This document discloses, among others, examples and implementations of devices and techniques for locking a laser in frequency by locking a reference laser to a reference frequency and an optical interferometer to the reference laser and by locking the laser to a selected frequency produced by the optical interferometer.

In one aspect, a device for locking a target laser in frequency is provided to include an optical frequency reference device that produces an optical reference frequency of high precision and stability; a reference laser that is locked to the optical reference frequency and produces reference laser light; an optical interferometer that is optically coupled to the reference laser to receive the reference laser light and produces an optical interference pattern from the received reference laser light; a first locking circuit that locks the optical interferometer to the reference laser based on the optical interference from the received reference laser light; a target laser that is tunable in frequency to produce target laser light and is coupled to the optical interferometer to direct the target laser light into the optical interferometer to cause optical interference of the target laser light; and a second locking circuit that controls the target laser to tune target laser frequency based on the optical interference of the target laser light in a way that locks the target laser to a selected frequency in the optical interference of the target laser light. The selected frequency in the optical interference of the target laser light is different from the optical reference frequency of the optical frequency reference device.

In another aspect, a method for locking a target laser in frequency is provided to include locking a reference laser to an optical reference frequency to produce reference laser light at a reference laser frequency that is locked relative to the optical reference frequency; operating an optical interferometer to receive the reference laser light from the reference laser and to lock the optical interferometer to the reference laser based on optical interference produced from the received reference laser light by the optical interferometer; operating a target laser that is tunable in frequency to produce target laser light and to couple the target laser light into the optical interferometer to cause optical interference of the target laser light in the optical interferometer; and controlling the target laser to tune target laser frequency based on the optical interference of the target laser light in a way that locks the target laser to the optical interferometer.

In yet another aspect, a laser device for locking a target laser in frequency is provided to include an optical frequency reference device that produces an optical reference frequency of high precision and stability; a reference laser that is tunable in frequency and produces reference laser light that is locked in frequency relative to the optical reference frequency of the optical frequency reference device; and an optical interferometer that includes two optical paths that optically interfere with each other and receive the reference laser light from the reference laser, and a tunable optical delay device in the two optical paths that is adjustable to tune an amount of optical delay produced by the tunable optical delay device. This device includes a delay control device that controls the tunable optical delay device to cause the tuning of the amount of optical delay produced by the tunable optical delay device and a first photodetector that is coupled to the optical interferometer to receive light of optical interference of the two optical paths based on received reference laser light from the reference laser. The first photodetector is configured to convert the light of optical interference into a first detector signal. A first locking circuit receives the first detector signal and controls the delay control device based on the received first detector signal to lock a relative delay between the two optical paths of the optical interferometer to the reference laser in frequency. A target laser that is tunable in frequency is provided to produce target laser light at a target laser frequency. The target laser is coupled to the optical interferometer so that the target laser light is coupled into the two optical paths of the optical interferometer to cause optical interference of the target laser light in the two optical paths. This device includes a second photodetector that is coupled to the optical interferometer to receive light of optical interference of the two optical paths based on received target laser light from the target laser and produces a second detector signal; and a second locking circuit that controls the target laser to tune the target laser frequency based on the second detector signal in a way that locks the target laser to the optical interferometer in frequency without being locked to the optical reference frequency of the optical frequency reference device.

These and other aspects, associated examples and implementations are described in detail in the drawings, the description, and the claims.

DETAILED DESCRIPTION

Various laser locking techniques for locking a tunable laser are configured to directly lock the laser frequency of the tunable laser relative to a fixed optical reference frequency. Tuning the laser frequency of such a locked tunable laser can be achieved by, for example, using optical wave meters to provide wavelength calibration to tuning the locked laser or using an optical Fabry-Perot cavity that is tunable and stabilized to the optical reference frequency (e.g., an atomic or molecular absorption line).

Examples and implementations of devices and techniques described in this document for locking a tunable target laser use an optical interferometer that is stabilized and locked to an optical reference frequency as an intermediate optical frequency reference to lock the target laser and use the optical interference pattern of the optical interferometer to provide multiple locking reference frequencies to tune and lock the target laser over a spectral range. The optical interferometer can be used to provide high precision and stability in locking the target laser and quasi-continuous tuning capability. As an example, a compact fiber Mach-Zehnder Interferometer (MZI) can be stabilized to an atomic absorption line for locking and tuning the target laser.

Figure 1:
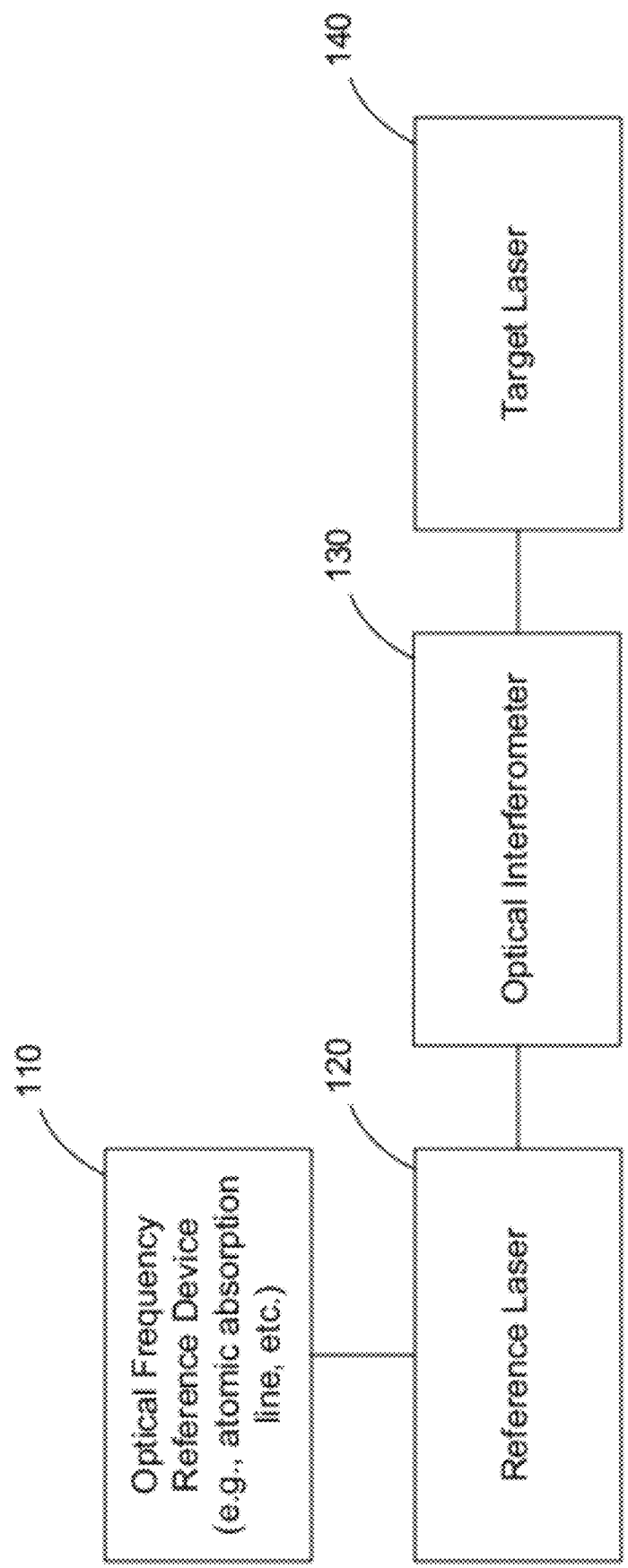
FIG. 1 shows an example of a device for locking a target laser that includes an optical frequency reference device, a tunable reference laser, and an optical interferometer which is locked to the reference laser and provides a frequency reference for locking the target laser.

FIG. 1 shows an example of a device for locking a target laser 140 that includes an optical frequency reference device 110, a reference laser 120, and an optical interferometer 130 which is locked to the reference laser 120 and provides a frequency reference for locking the target laser 140. The optical frequency reference device 110 can be implemented in various configurations to provide an optical reference frequency with suitable precision and stability. For example, atomic or molecular absorption line, an optical resonance of an optical cavity of high finesse and stability, or the resonance frequency of a stabilized fiber Bragg grating can be used as the optical frequency reference for locking the target laser 140. Atomic or molecular absorptions tend to have superior stability under changing environmental conditions such as temperature and pressure variations or the presence of electromagnetic fields. An optical frequency reference device 110 for producing an atomic or molecular absorption line can include a structure that contains atoms or molecules such as an atomic vapor cell or a fiber structure containing specific atoms or molecules.

In FIG. 1, the reference laser 120 is locked and stabilized to the optical reference frequency of the optical frequency reference device 110. In some implementations, due to the presence of optical interferometer 130, the locked reference laser 120 can be fixed in frequency and is not required to be tunable under the locking condition for tuning the target laser 140. In other implementations, the locked reference laser 120 can be tunable under the locking condition. The reference laser 120 locked to the optical reference frequency 110 provides a mechanism for locking and stabilizing the optical interferometer 130 to the optical reference frequency 110 to allow transfer of the frequency precision and stability of the optical reference frequency 110 to the optical interferometer 130. More specifically, the optical interferometer 130 receives the reference laser light from the locked reference laser 120 to produce optical interference from the received reference laser light and uses the information in the optical interference to produce an error signal for tuning and adjusting the optical interferometer in locking it to the reference laser 120.

Once locked to the reference laser 120, the optical interferometer 130 becomes a stabilized reference for locking and tuning the target laser 140. The optical interferometer 130 receives target laser light from the target laser 140 to produce optical interference from the received target laser light. The information in this optical interference can be used to produce a target laser error signal that indicates fluctuations or deviations of the target laser frequency from the optical interferometer 130 that is locked in frequency. Based on this target laser error signal, the target laser 140 is tuned or adjusted to minimize or reduce the fluctuations or deviations of the target laser frequency from the optical interferometer 130 and to lock the target laser 140.

Figure 2:
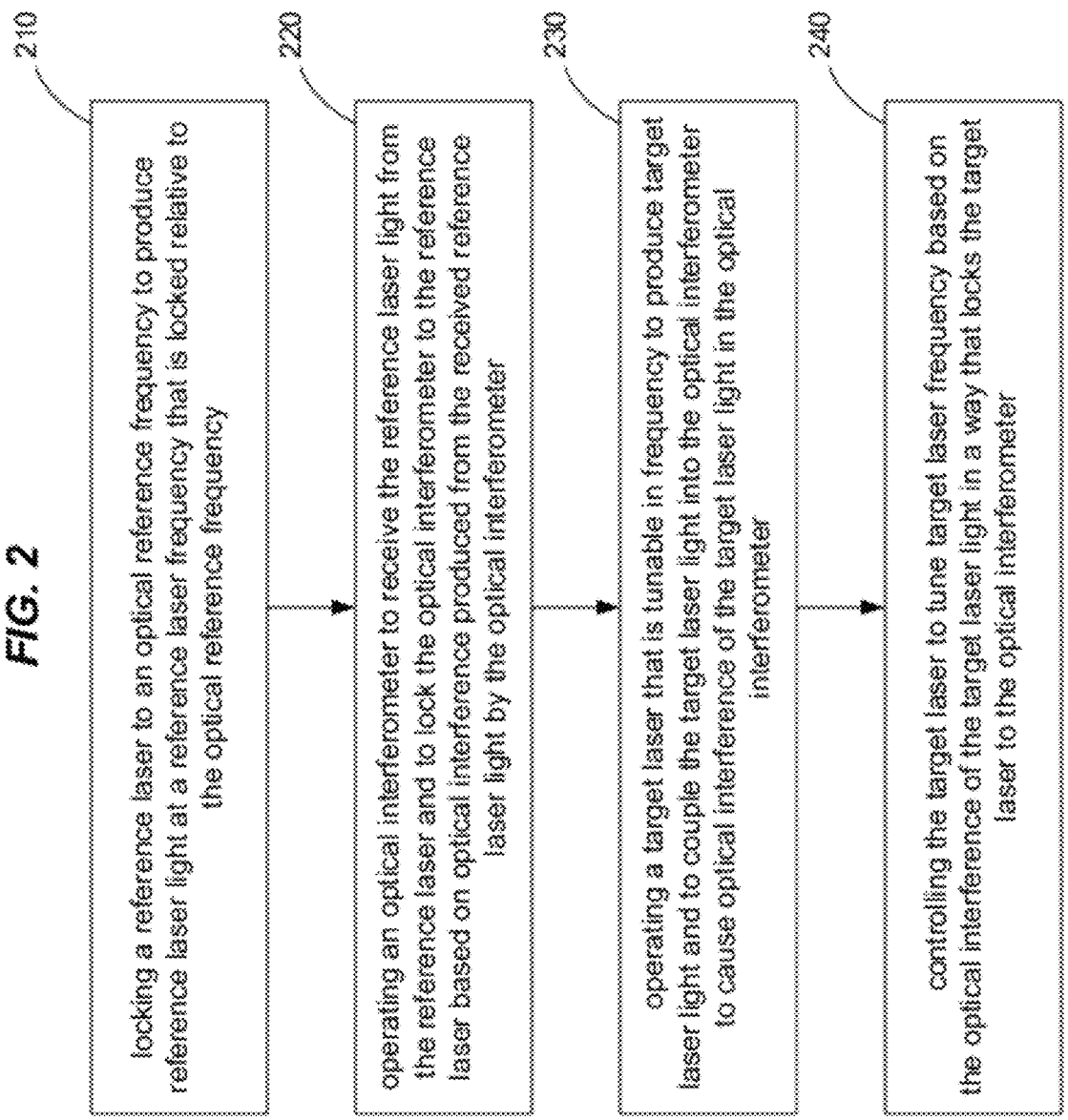
FIG. 2 shows an operation of the device in FIG. 1 for locking the target laser.

FIG. 2 shows an operation of the device in FIG. 1 for locking the target laser. The method includes locking the reference laser 120 to the optical reference frequency 110 to produce reference laser light at a reference laser frequency that is locked relative to the optical reference frequency 110 (step 210), and operating the optical interferometer 130 to receive the reference laser light from the reference laser 120 and to lock the optical interferometer 120 to the reference laser 120 based on optical interference produced from the received reference laser light by the optical interferometer 130 (step 220). The target laser 140 that is tunable in frequency is operated to produce target laser light and to couple the target laser light into the optical interferometer 130 to cause optical interference of the target laser light in the optical interferometer 130 (step 230). The target laser 140 is controlled to tune target laser frequency based on the optical interference of the target laser light in a way that locks the target laser 140 to the optical interferometer 130 (step 240).

Figure 3:
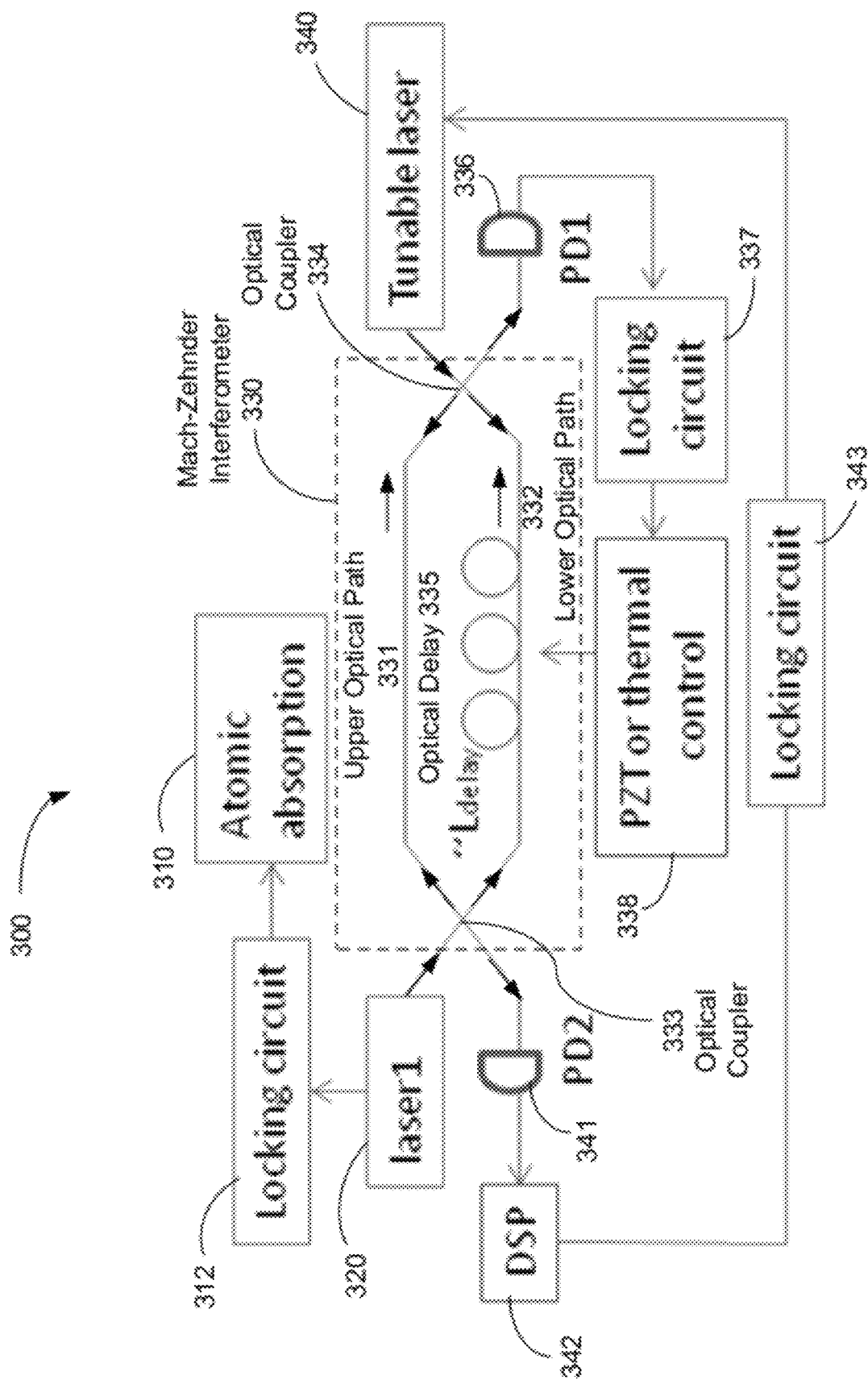
FIG. 3 shows an example of a device for locking a target laser to an optical Mach-Zehnder interferometer which is locked to a reference laser that is stabilized to an optical reference.

FIG. 3 shows an example of a device 300 based on the design in FIG. 1 for locking a target laser 340 to an optical Mach-Zehnder interferometer 330 which is locked to a reference laser 320 that is stabilized to an optical reference 310. The optical frequency reference device 310 uses an atomic absorption line to provide a precise and stable optical reference frequency as the foundation for the frequency locking of the device 300. The reference laser 320 is tunable in frequency and produces reference laser light that is locked in frequency relative to the optical reference frequency of the optical frequency reference device 310. A reference laser locking circuit 312 is provided to be coupled between the reference laser 320 and the optical frequency reference device 310 to lock the reference laser 320. Various laser locking mechanism can be used for the locking circuit 310.

In FIG. 3, the optical Mach-Zehnder interferometer 330 is an example of the optical interferometer 130 in FIG. 1 includes two optical paths 331 (upper optical path) and 332 (lower optical path) that are coupled to each other at one end at a first optical coupler 333 and the other end at a second optical coupler 334. The reference laser light from the reference laser 320 is directed to the first optical coupler 331 which, in turn, splits the received reference laser light into a first part in the upper optical path 331 and a second part in the lower optical path 332. These two parts of the received reference laser light propagate in their respective paths 331 and 332 to the second optical coupler 334 where they meet and optically interfere with each other to produce optical interference pattern indicating a relative optical delay between the paths 331 and 332. A portion of the combined reference laser light from the two paths 331 and 332 is coupled out by the second optical coupler 334 to a first photodetector (PD1) 336 for locking the interferometer 330 to the reference laser 320. The interferometer 330 is a tunable interferometer where a tunable optical delay device 335 is coupled in the two optical paths 331 and 332 that is adjustable to tune an amount of optical delay produced by the tunable optical delay device 335. In this example, the optical delay device 335 is shown to be in the lower optical path 332 and is controlled or tuned by a delay control device 338 to cause the tuning of the amount of optical delay produced by the tunable optical delay device 335. In other implementations, the tunable optical delay device 335 can be in the upper optical path 331 or both paths 331 and 332 can have their respective tunable optical delay devices. The first photodetector 336 is configured to convert the light of optical interference from the reference laser light at the optical coupler 334 into a first detector signal. A first locking circuit 337 for locking the interferometer 330 to the reference laser 320 receives the first detector signal and controls the delay control device based on the received first detector signal to lock a relative delay between the two optical paths 331 and 332 of the optical interferometer 330 to the reference laser 320 in frequency. This locking establishes the optical interferometer 330 as a reference for locking and tuning the target laser 340.

The target laser 340 is tunable in frequency and is provided to produce target laser light at a target laser frequency that is locked and tunable. The target laser 340 is coupled to the second optical coupler 334 in the optical interferometer 330 so that the target laser light is coupled into the two optical paths 331 and 332. The second optical coupler 334 splits the received target laser light into two parts in the paths 331 and 332 in the opposite directions of the received two parts of the reference laser light. The two parts of the received target laser light propagate through the optical paths 331 and 332 to meet and interfere at the first optical coupler 333 to cause optical interference of the target laser light in the two optical paths 331 and 332. A second photodetector (PD2) 341 is coupled to the optical interferometer 330 to receive light of optical interference of the two optical paths 331 and 332 based on received target laser light from the target laser 340 and produces a second detector signal indicating a deviation of the target laser frequency from a reference selected in the optical interference pattern. A second locking circuit 343 that controls the target laser 340 to tune the target laser frequency based on the second detector signal in a way that locks the target laser 340 to the optical interferometer 330 in frequency without being locked to the optical reference frequency of the optical frequency reference device 310.

In the exemplary device 300 in FIG. 3, a digital signal processor (DSP) 342 is shown to be coupled between the second photodetector 341 and the second locking circuit 343. The DSP 342 receives the second detector signal and produces a DSP output signal to the second locking circuit 343. The second locking circuit 343 uses the received DSP output signal to control the target laser 340 to tune the target laser frequency while locking the target laser 340 to the optical interferometer 330 in frequency. This DSP 342 can be configured to process the optical interference pattern of the two parts of the received target laser light in the paths 331 and 332 with the relative delay controlled by the optical delay device 335 and to select a reference frequency to which the target laser 340 is locked by the second locking circuit 343. This selection of the reference frequency by the DSP 342 allows the target laser 340 to be locked at a range of different reference frequencies and to be tuned within the spectral range of these reference frequencies.

Figure 4:
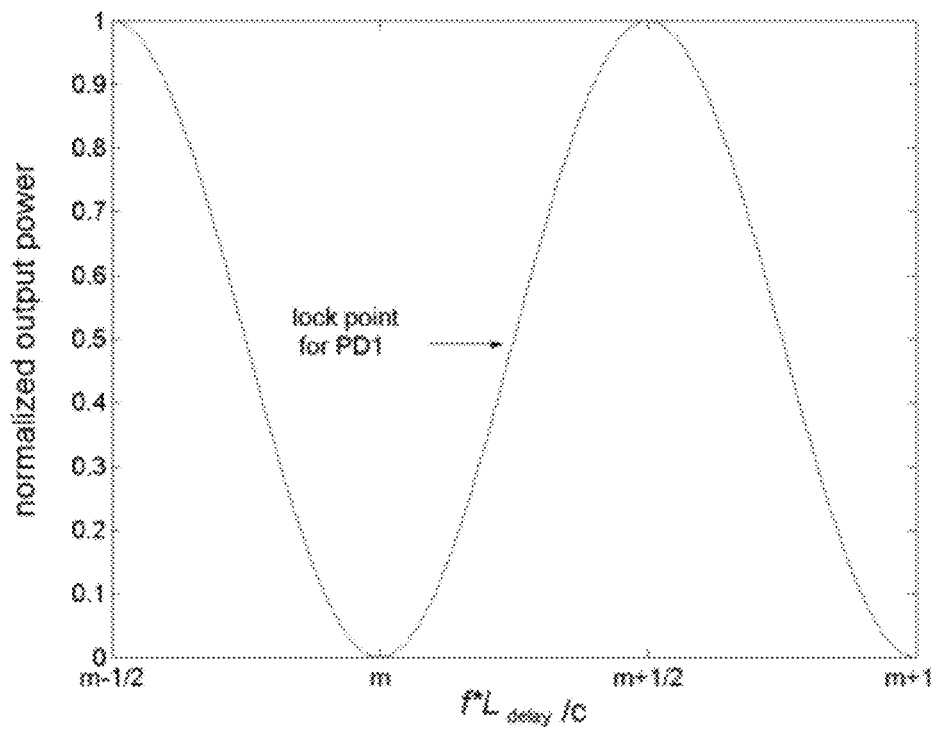
FIG. 4 shows an example of the normalized output power of the optical Mach-Zehnder interferometer in FIG. 3 with respect to the relative delay between two optical paths.

The reference laser 320 can be implemented by a semiconductor laser that is frequency locked to a stable atomic/molecular absorption reference provided by the device 310. The MZI 330 can be implemented as a fiber Mach-Zehnder interferometer with a differential optical delay of $L_{delay}$ where fiber paths are used to form the two paths 331 and 332. In some implementations, the fiber interferometer can be made of polarization maintaining fiber to maintain the optical polarization of the light in the paths 331 and 332 and to maintain a stable interference fringe for both optical interference of the reference laser light and the optical interference of the target laser light. The signal at the first photodetector (PD1) 336 can be a sinusoidal function of the product $f_1 L_{delay}$ as shown in FIG. 4. The linewidth of the laser should be much smaller than the free spectral range (FSR) of the fiber interferometer 330 for the locking system to properly operate.

In the example in FIG. 3, the output of the first photodetector (PD1) 336 is used to feedback control the optical length of the delay device 335 by, e.g., either Piezo tuning or thermal tuning, so that the signal is locked at the middle point of the interference fringe shown in FIG. 4. The frequency of the reference laser 320 and the differential delay of the two parts of the reference laser light in the optical paths 331 and 332 satisfy the relation $$\frac{f_1 L_{delay}}{c} = m_1 + \frac{1}{4} + \Delta m_1 \quad (1)$$

where $\Delta m_1$ represents the residual noise of the imperfect locking system for locking the reference laser 320 and should be much smaller than 1. The target laser light from the target laser 340 is sent into the other end of the fiber interferometer 330 via the second optical coupler 334 and the optical interference of the target laser light is detected at the second photodetector (PD2) 341. The signal of the second photodetector (PD2) 341 can be locked at an arbitrary point on the interference fringe under the following locking condition:

$$\frac{f_2 L_{delay}}{c} = m_2 + \Delta m_2 \quad (2)$$

The FSR of the fiber interferometer 330 and the delay satisfy the following condition:

$$\frac{f_{FSR} L_{delay}}{c} = 1 \quad (3)$$

Based on Eq. (1)-(3), the variation of the frequency of the target laser 340 and the FSR are correlated to that of the reference laser 320 by $$\frac{\Delta f_2}{f_2} = \frac{\Delta f_1}{f_1} + \frac{\Delta m_1}{m_1} + \frac{\Delta m_2}{m_2} \quad (4)$$

$$\frac{\Delta f_{FSR}}{f_{FSR}} = \frac{\Delta f_1}{f_1} + \frac{\Delta m_1}{m_1}$$

Therefore, the above use of the reference laser 320 and the optical interferometer 330 transfers the superior stability and precision of the atomic absorption line to both the reference laser 320 and the target laser 340. Notably, due to the presence of the optical interferometer 330, the frequency of the locked target laser 340 is not limited to that of the absorption line 310 and can be at various reference frequencies available in the interference pattern produced from the received target laser light by the optical interferometer 330.

The stability of the frequency of the target laser 340 by using a numerical example. The reference laser 320 is frequency locked to the atomic/molecular absorption line, it is known that a precision and stability of sub-MHz can be achieved in locking the reference laser 320, i.e. $\Delta f_1 < 1$ MHz. For a 1550-nm semiconductor laser as the reference laser 320 and a fiber delay of ~200 m in the path 332, values of $m_1$ and $m_2$ of about $2 \times 10^8$, the frequency stability of the locked target laser 340 can be estimated by Eq. (4) to be $\Delta f_2 < 1$ MHz.

Figure 5:
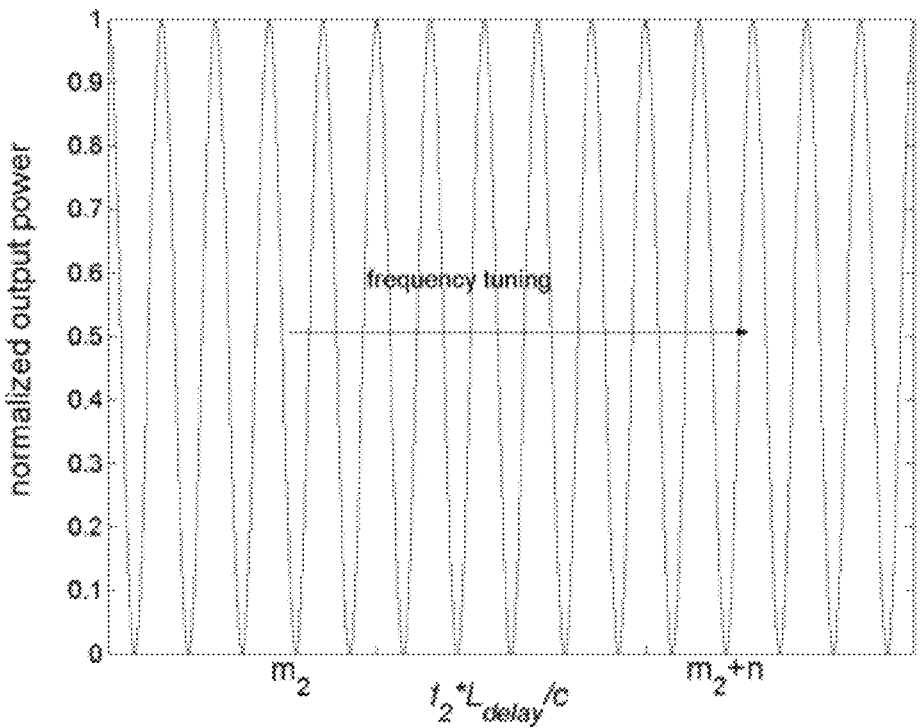
FIG. 5 illustrates tuning of the locked target laser frequency by selecting a locking point in the optical interference as marked in the normalized output power of the optical Mach-Zehnder interferometer in FIG. 3 with respect to the relative delay between two optical paths.

In tuning the frequency of the locked target laser 340, the output of the second photodetector (PD2) 341 shows many oscillations due to the change in the optical interference pattern. This change can be counted by the DSP 342 (e.g., a microprocessor). FIG. 5 illustrates tuning of the locked target laser frequency by selecting a locking point in the optical interference as marked in the normalized output power of the optical Mach-Zehnder interferometer in FIG. 3 with respect to the relative delay between two optical paths.

For example, assuming the fringes detected ub the output of the second photodetector 341 have swept through n oscillations and the target laser 340 is locked to somewhere of the fringe pattern, the corresponding frequency tuning can be determined by $$f_{tune} = n f_{FSR} \tag{5}$$

wherein n doesn't have to be an integer number since the target laser 340 can be locked to any point of the interference fringe pattern. From Eq. 5, the uncertainty of the tuning is $$\Delta f_{tune} = \Delta n * f_{FSR} + n * \Delta f_{FSR} = \Delta n * f_{FSR} + f_{tune} * \left( \frac{\Delta f_1}{f_1} + \frac{\Delta m_1}{m_1} \right) \tag{6}$$

where $\Delta n$ is the residual error of the microprocessor or DSP 342 and locking system (i.e., the locking circuit 343) and can be much smaller than 1 in practical cases. We can estimate the accuracy of the tuning using the same numbers aforementioned, i.e. $\Delta f_1 < 1$ MHz and a fiber delay of ~200 m ($f_{FSR}$~1 MHz). For the application of tunable microwave filter, the frequency tuning range of the laser is usually less than 18 GHz, i.e. $f_{tune} < 18$ GHz. Assuming the wavelength of both lasers 320 and 340 are around 1550 nm, Eq. 6 suggests that $f_{tune}$ is much less than 1 MHz.

In the above analysis the dispersion of the fiber is not considered but can be calibrated and taken into account with the microprocessor.

In the above example of locking the reference laser 320 to the atomic/molecular absorption line and locking the fiber Mach-Zehnder interferometer 330 to the reference laser 320, we can essentially transfer the ultra high stability of the atomic/molecular absorption line to any other frequency within the spectral range of the operation frequency of the fiber interferometer 330. Locking the target laser 340 to the interferometer 330, the frequency stability of the target laser 340 is linked to that of the atomic/molecular absorption line. When the target laser 340 is frequency tuned, counting the number of the interference fringes that have been swept through by the tuning provides a way of measuring a frequency tuning with a high precision (e.g., in the sub-MHz level). Compared to locking designs using a Fabry-Perot interferometer of discrete frequency reference, the Mach-Zehnder interferometer can provide a quasi-continuous frequency reference. The absolute frequency accuracy and stability of the locked laser are limited by those of the atomic/molecular absorption line and the performance of the locking system.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations, modifications and enhancements of the disclosed implementations and other implementations can be made based on what is described and illustrated in this document.

What is claimed is:

1. A laser device for locking a target laser in frequency, comprising:

an optical frequency reference device that produces an optical reference frequency of high precision and stability;

a reference laser that is tunable in frequency and produces reference laser light that is locked in frequency relative to the optical reference frequency of the optical frequency reference device;

an optical interferometer that includes two optical paths that optically interfere with each other and receive the reference laser light from the reference laser, and a tunable optical delay device in the two optical paths that is adjustable to tune an amount of optical delay produced by the tunable optical delay device;

a delay control device that controls the tunable optical delay device to cause the tuning of the amount of optical delay produced by the tunable optical delay device;

a first photodetector that is coupled to the optical interferometer to receive light of optical interference of the two optical paths based on received reference laser light from the reference laser, the first photodetector configured to convert the light of optical interference into a first detector signal;

a first locking circuit that receives the first detector signal and controls the delay control device based on the received first detector signal to lock a relative delay between the two optical paths of the optical interferometer to the reference laser in frequency;

a target laser that is tunable in frequency and produces target laser light at a target laser frequency, the target laser being coupled to the optical interferometer so that the target laser light is coupled into the two optical paths of the optical interferometer to cause optical interference of the target laser light in the two optical paths;

a second photodetector that is coupled to the optical interferometer to receive light of optical interference of the two optical paths based on received target laser light from the target laser and produces a second detector signal; and a second locking circuit that controls the target laser to tune the target laser frequency based on the second detector signal in a way that locks the target laser to the optical interferometer in frequency without being locked to the optical reference frequency of the optical frequency reference device.

2. The device as in claim 1, wherein:
the optical frequency reference device provides a molecular or atomic absorption line at the optical reference frequency.

3. The device as in claim 1, wherein:
the optical frequency reference device includes an optical cavity operating at the optical reference frequency.

4. The device as in claim 1, wherein:
the optical frequency reference device includes a fiber Bragg grating operating at the optical reference frequency.

5. The device as in claim 1, wherein:
the reference laser is a tunable semiconductor laser.

6. The device as in claim 1, wherein:
the optical interferometer includes a fiber Mach-Zehnder interferometer.

7. The device as in claim 6, wherein:
the fiber Mach-Zehnder interferometer includes polarization-maintaining fiber.

8. The device as in claim 1, wherein:
the tunable optical delay device includes a piezo tuning device that controls an optical length of the tunable optical delay device.

9. The device as in claim 1, wherein:
the tunable optical delay device includes a thermal tuning device that controls an optical length of the tunable optical delay device.

10. The device as in claim 1, wherein:
the reference laser has a reference laser linewidth that is less than a free spectral range (FSR) of the optical interferometer.

11. The device as in claim 1, comprising:
a digital signal processor (DSP) coupled between the second photodetector and the second locking circuit, the DSP receiving the second detector signal and producing a DSP output signal to the second locking circuit, wherein the second locking circuit uses the received DSP output signal to control the target laser to tune the target laser frequency while locking the target laser to the optical interferometer in frequency.

12. A method for locking a target laser in frequency, comprising:
locking a reference laser to an optical reference frequency to produce reference laser light at a reference laser frequency that is locked relative to the optical reference frequency;
operating an optical interferometer to receive the reference laser light from the reference laser and to lock the optical interferometer to the reference laser based on optical interference produced from the received reference laser light by the optical interferometer;
operating a target laser that is tunable in frequency to produce target laser light and to couple the target laser light into the optical interferometer to cause optical interference of the target laser light in the optical interferometer; and
controlling the target laser to tune target laser frequency based on the optical interference of the target laser light in a way that locks the target laser to the optical interferometer.

13. The method as in claim 12, wherein:
the optical interferometer includes two optical paths that optically interfere with each other to cause optical interference of the received reference laser light in the two optical paths.

14. The method as in claim 13, comprising:
tuning a relative optical delay between the two optical paths based optical interference of the two optical paths with respect to the received reference laser light while maintaining locking of the optical interferometer to the reference laser.

15. The method as in claim 14, comprising:
coupling the target laser light into the two optical paths of the optical interferometer to cause optical interference of the target laser light in the two optical paths; and
controlling the target laser to tune the target laser frequency based on optical interference of the two optical paths in locking the target laser relative to the optical reference frequency.

16. The method as in claim 12, comprising:
selecting a frequency in the optical interference of the target laser light produced by the optical interferometer to lock the target laser to the optical interferometer.

17. The method as in claim 16, comprising:
using the selection of the frequency in the optical interference of the target laser light produced by the optical interferometer to tune a locking frequency of the locked target laser so that the target laser can be locked at different locking frequencies under the same value of the optical reference frequency to which the reference laser is locked.

18. A device for locking a target laser in frequency, comprising:
an optical frequency reference device that produces an optical reference frequency of high precision and stability;
a reference laser that is locked to the optical reference frequency and produces reference laser light;
an optical interferometer that is optically coupled to the reference laser to receive the reference laser light and produces an optical interference pattern from the received reference laser light;
a first locking circuit that locks the optical interferometer to the reference laser based on the optical interference from the received reference laser light;
a target laser that is tunable in frequency to produce target laser light and is coupled to the optical interferometer to direct the target laser light into the optical interferometer to cause optical interference of the target laser light; and
a second locking circuit that controls the target laser to tune target laser frequency based on the optical interference of the target laser light in a way that locks the target laser to a selected frequency in the optical interference of the target laser light, wherein the selected frequency in the optical interference of the target laser light is different from the optical reference frequency of the optical frequency reference device.

19. The device as in claim 18, comprising:
a frequency selection circuit that selects the selected frequency in the optical interference of the target laser light and seconds information of the selected frequency to the second locking circuit which performs locking the target laser to the selected frequency.

20. The device as in claim 19, wherein:
the frequency selection circuit includes a digital signal processor that uses interference fringes to select the selected frequency in the optical interference of the target laser light.

* * * * *